United States Patent
Vannucci et al.

(10) Patent No.: US 7,718,505 B2
(45) Date of Patent: May 18, 2010

(54) METHOD OF FORMING A SEMICONDUCTOR STRUCTURE COMPRISING INSULATING LAYERS WITH DIFFERENT THICKNESSES

(75) Inventors: Nicola Vannucci, Fuernitz (AT); Hubert Maier, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 11/767,060

(22) Filed: Jun. 22, 2007

(65) Prior Publication Data
US 2008/0315303 A1 Dec. 25, 2008

(51) Int. Cl.
*H01L 21/76* (2006.01)

(52) U.S. Cl. .................. 438/424; 257/374; 257/305; 257/E29.257; 257/E29.258; 257/E29.26; 438/221; 438/225; 438/296; 438/298; 438/425; 438/426; 438/427; 438/433; 438/435

(58) Field of Classification Search .......... 257/374, 257/305, E29.257, E29.258, E29.26; 438/221, 438/225, 296, 298, 424, 425, 426, 427, 433, 438/435
See application file for complete search history.

(56) References Cited

U.S. PATENT DOCUMENTS

| | | | | |
|---|---|---|---|---|
| 6,057,209 A * | 5/2000 | Gardner et al. | ............... | 438/427 |
| 6,262,453 B1 * | 7/2001 | Hshieh | ............... | 257/341 |
| 6,358,816 B1 * | 3/2002 | Singh et al. | ............... | 438/424 |
| 6,861,333 B2 * | 3/2005 | Wu et al. | ............... | 438/424 |
| 2002/0072198 A1 * | 6/2002 | Ahn | ............... | 438/424 |
| 2002/0076900 A1 * | 6/2002 | Park et al. | ............... | 438/424 |
| 2005/0173777 A1 * | 8/2005 | Grivna | ............... | 257/510 |
| 2006/0145247 A1 * | 7/2006 | Zundel et al. | ............... | 257/330 |
| 2006/0244104 A1 * | 11/2006 | Ozeki et al. | ............... | 257/587 |
| 2007/0059887 A1 * | 3/2007 | Poelzl et al. | ............... | 438/270 |
| 2007/0059898 A1 * | 3/2007 | Shin et al. | ............... | 438/424 |

* cited by examiner

*Primary Examiner*—David Vu
*Assistant Examiner*—Brandon Fox
(74) *Attorney, Agent, or Firm*—Dicke, Billig & Czaja, PLLC

(57) ABSTRACT

The method of forming a semiconductor structure in a substrate comprises, forming a first trench with a first width $W_e$ and a second trench with a second width $W_c$, wherein the first width $W_e$ is larger than the second width $W_c$, depositing a protection material, lining the first trench, covering the substrate surface and filling the second trench and removing partially the protection material, wherein a lower portion of the second trench remains filled with the protection material.

38 Claims, 10 Drawing Sheets

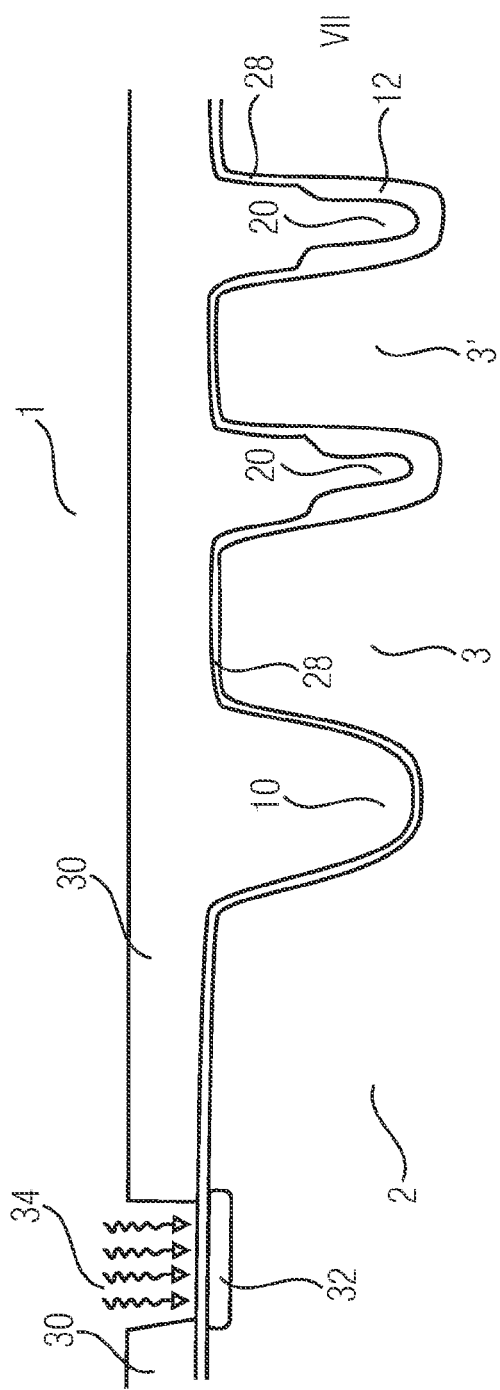
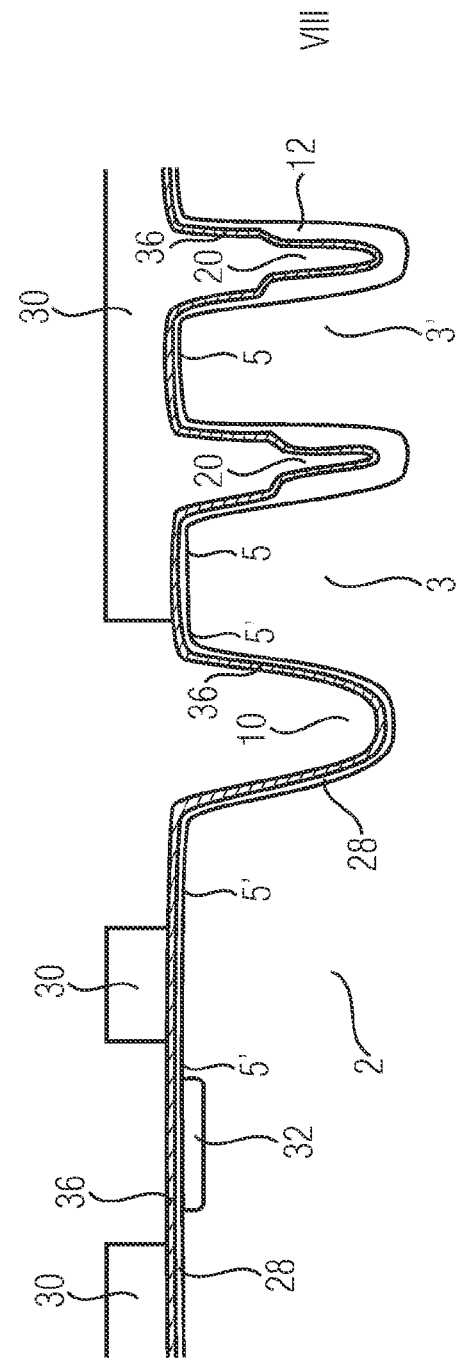

METHOD OF FORMING A SEMICONDUCTOR STRUCTURE COMPRISING INSULATING LAYERS WITH DIFFERENT THICKNESSES

BACKGROUND OF THE INVENTION

The present invention relates to a method of forming a semiconductor structure in a substrate comprising insulating layers with a different thickness and a semiconductor structure formed therewith.

Semiconductor structures can comprise insulating layers, with a different thickness, in order to fulfill certain tasks. For example, technologies for integrated circuits (IC) offering high voltage vertical trench double diffused metal oxide semiconductor (TDMOS) as power transistors, need a thick insulating layer, for example, an oxide layer on the bottom and the side walls of the trenches. This thick oxide layer, here named also as field plate oxide (FPOX) can be thermally grown at a high temperature. After growth, the FPOX can be structured by applying additional processes, so that it remains on the bottom and the side walls of the trenches of the central part of the cell field trenches and all over inside the peripheral trenches. At the same time, another thick oxide on the planar part of the semiconductor structure should be present, this thick oxide is here also named field oxide (FOX). The field oxide can be grown at a lower temperature than the field plate oxide. This is compatible with a previous implantation of the semiconductor structure, which is needed to ensure the correct functionality of the structure. The implanted region can fulfill a certain task, for example, it can act a channel stop-zone for a parasitic depletion MOSFET. A n-type implantation for example can be used for a depletion n-channel MOSFET formed in the substrate. The field plate oxide and the field oxide have their own optimal growth conditions and final thickness. Normally, the desired thickness of the field oxide is greater than the thickness of the field plate oxide.

For the fabrication of such a semiconductor structure, e.g. a TDMOS, comprising insulating layers with different thickness, it is desirable to reduce the number of mask steps for cost and yield reasons and to ensure, at the same time, the proper functionality of other semiconductor structure parameters. For the TDMOS transistors a soft topography of a boron-phosphorus-silicate-glass (BPSG) layer covering the field oxide should be for example also ensured.

SUMMARY OF THE INVENTION

In accordance with embodiments, the present invention provides a method of forming a semiconductor structure in a substrate comprising, forming a first trench with a first width $W_e$ and a second trench with a second width $W_c$, wherein the first width $W_e$ is larger than the second width $W_c$, depositing a protection material, which is lining the first trench, covering the substrate surface and filling the second trench and removing partially the protection material, wherein a lower portion of the second trench remains filled with the protection material.

Optional the method comprises forming a first insulating layer and a first auxiliary layer thereon, both lining the first and the second trench and covering the substrate surface. The method further comprises optionally processing the semiconductor structure, wherein the first insulating layer remains in the lower portion of the second trench, forming a second insulating layer lining the first trench and a part of the TDMOS-Mesa on edge and eventually an upper portion of the second trench and covering the substrate surface. The method further comprises optionally depositing a second auxiliary layer lining the first and the second trench and covering the substrate surface, structuring the semiconductor structure, wherein the second trench and at least a part of the substrate surface remains lined respectively covered with the second auxiliary layer and forming a third insulating layer, lining the first trench and at least another part of the substrate surface.

According to another embodiment, the present invention provides a semiconductor structure comprising a first trench with a first width $W_e$ and a second trench with a second width $W_c$ being formed in the substrate, wherein the first width $W_e$ is larger than the second width $W_c$ of the second trench, wherein a lower portion of the second trench is lined with the first insulating layer, wherein an upper portion of the second trench is lined and at least a part of the substrate surface is covered with a second insulating layer and wherein the first trench is lined and another part of the substrate surface is covered with a third insulating layer and a contact region between the third insulating layer and a second insulating layer is formed like a bird's beak.

BRIEF DESCRIPTION OF THE DRAWINGS

FIG. 8 shows a schematic cross sectional view of the semiconductor structure comprising a region of the substrate, which is not covered by a resist and which is doped in order form a channel stop-zone;

FIG. 9 shows a schematic cross sectional view of the semiconductor structure after a photolithographic mask step, wherein the second trench and at least a part if the substrate surface remains lined respectively covered with the second auxiliary layer deposited in a preceding process;

DETAILED DESCRIPTION

With reference to the accompanying FIGS. 1-15, explanations and embodiments relating to the method of forming semiconductor structure in a substrate and a semiconductor structure formed therewith will be depicted in detail below.

Figure 1:
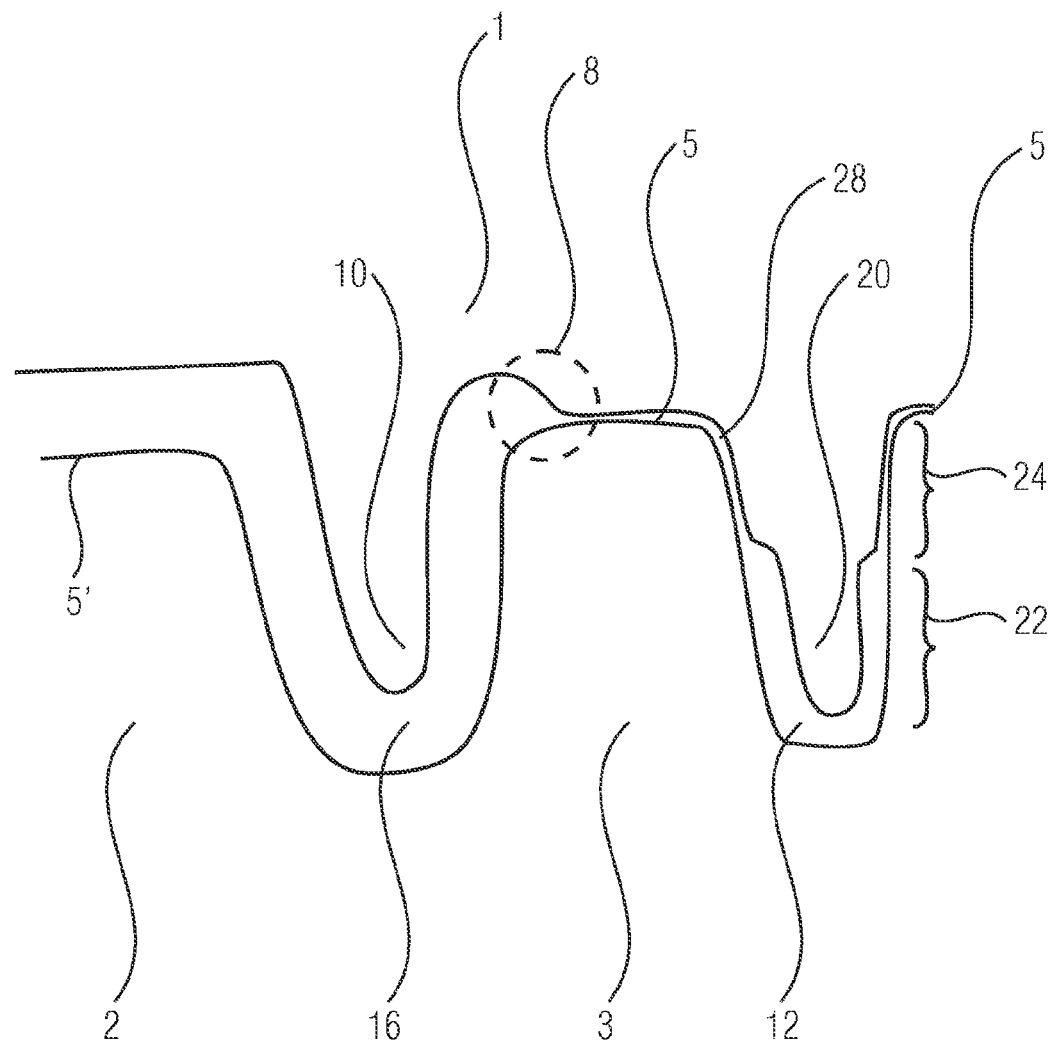
FIG. 1 shows a schematic cross sectional view of a semiconductor structure in a substrate with a first and a second trench with a different width, comprising insulating layers with a different thickness.

FIG. 1 shows a schematic cross sectional view of a semiconductor structure 1 in a substrate 2 comprising a first trench 10 and a second trench 20 being formed in the substrate 2, wherein the width of the first trench is larger than the width of the second trench. A lower portion 22 of the second trench 20 is lined with a first insulating layer 12, wherein an upper portion 24 of the second trench 20 is lined and at least a part of the substrate surface 5 is covered with a second insulating layer 28. The first trench 10 is lined and another part of the substrate surface 5' is covered with a third insulating layer 16. A contact region 8 between the third insulating layer 16 and the second insulating layer 28 is formed like a bird's beak.

The above described semiconductor structure can be formed by applying the inventive method of forming a semiconductor structures in a substrate and the above mentioned optional steps. The substrate region 3 between two trenches is also called mesa region. In the following, the first trench 10 may be also named edge trench or peripheral trench and the second trench 20 may be named cell field trench, body trench or central trench.

The above described semiconductor structure with different insulating layers comprising a different thickness as it is suggested in FIG. 1 may be part of a semiconductor structure further comprising other layers, electrodes, doped regions and functionalities, for example, as in TDMOS transistors. The inventive method of forming a semiconductor structure is therefore not restricted to form a TDMOS transistor, but can also be applied to form other semiconductor structures utilizing the size, respectively the width of trenches or structures to line a first trench or structure and to fill a second trench with a protection material. By a subsequent removing of the protection material, for example with an isotropic etching the second trench or structure remains at least partially filled, whereas the first trench or structure can be uncovered. Because of the smaller size, respectively width of the filled second trench or structure, only the protection material in a upper portion of the second trench or structure can be removed by the isotropic etching, whereas the protection material lining the first trench or structure can be completely removed. The first trench or structure can therefore in subsequent optional processing steps differently processed then the second trenches or structures. That means by carefully adapting the size, respectively the width of the first and the second trenches a kind of structuring or self-masking without employing a physical mask step can be achieved.

Figure 2:
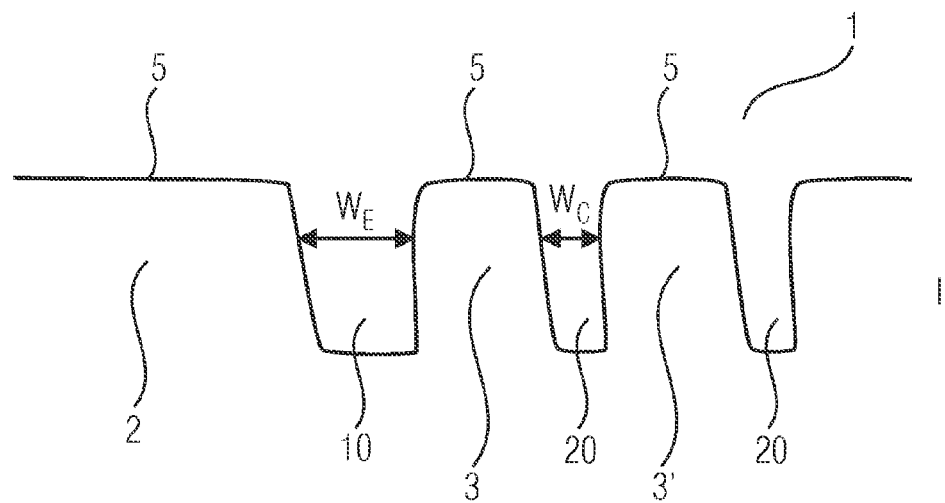
FIG. 2 shows a schematic cross sectional view of the two types of trenches with a different width in a substrate.

The method of forming a semiconductor structure 1 in a substrate 2 comprises forming a first trench 10 with a first width $W_e$ and a second trench 20 with a second width $W_c$, wherein the width $W_e$ of the first trench is larger than the width $W_c$ of the second trench. As it is shown in FIG. 2 the substrate 2 comprises afterwards a first trench 10 and a second trench 20. It should be mentioned that further second trenches can be formed in the substrate, as it is shown in FIG. 2 and also further first trenches (not shown in FIG. 2). The mesa region between the first trench and the second trench 3 and the mesa region 3' between two second trenches can comprise the same width. The first and the second trenches can be, for example, dry or wet etched from a main substrate surface in the following just called substrate surface 5. The substrate may comprise silicon or any other semiconductor material, which is used in order to form semiconductor structures or devices. The first and the second trenches can be trenches of a TDMOS cell field or the trenches of other semiconductor structures or devices eventually present in a semiconductor layout device library. The semiconductor structure should be designed with a proper layout in order to allow the performing of the described inventive method of forming a semiconductor structure. Other processing steps may be applied to the substrate before the first and the second trench are formed. The inventive method of forming a semiconductor structure in a substrate may be furthermore part of a more complex and comprehensive process to form a certain semiconductor structure, circuit or device.

Figure 4:
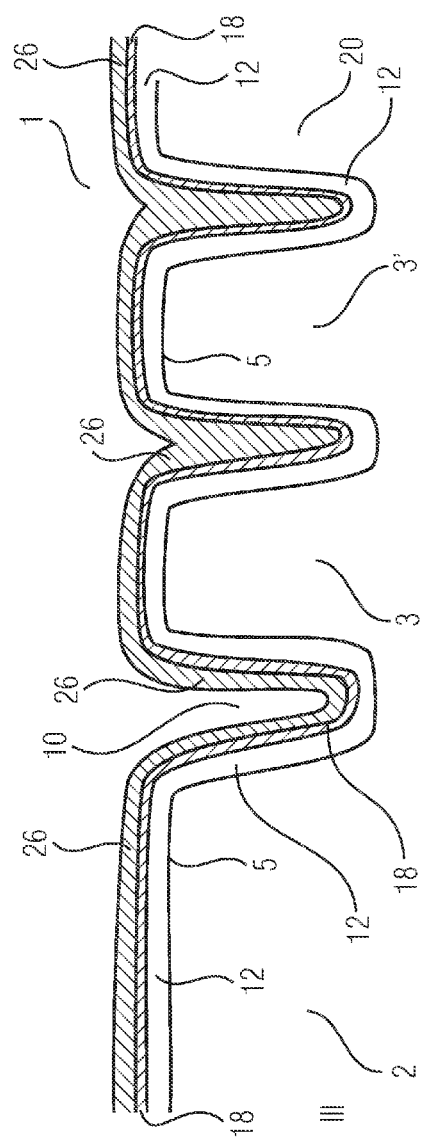
FIG. 4 shows a schematic cross sectional view of the two types of trenches lined respectively covered with the first auxiliary layer and a protection material lining the first trench covering the substrate surface and filling the second trench.

FIG. 4 depicts the semiconductor structure 1 in a substrate 2 after forming a first optional auxiliary layer 18, lining the first trench 10 and the second trenches 20 and covering the substrate surface 5. Furthermore a protection material 26 has been deposited, lining the first trench 10 covering the substrate surface 5 and filling the second trench 20.

After that, the protection material 26 can be removed from the first trench 10, lined with the protection material 26, from the upper portions 24 of the second trenches and from the substrate surface 5. The lower portion 22 of the second trenches remain filled with the protection material 26 (see FIG. 5). The removing of the protection material 26 can be performed with conventional means for semiconductor processing. Depending on the exact material of the protection layer, for example, dry or wet etching can be performed, wherein the etching can be performed isotropically. The protection material 26 can be poly-silicon, which can be deposited in the described way on the semiconductor structure. The width $W_e$ of the first trench, the width $W_c$ of the second trench, as well as the thickness of the protection material 26, deposited on the semiconductor structure, should be chosen carefully, in order to fill on the one hand the second trenches and line on the other hand the first trench.

The parameters should be chosen not to clog up the first trench 10 with the protection material 26.

Figure 5:
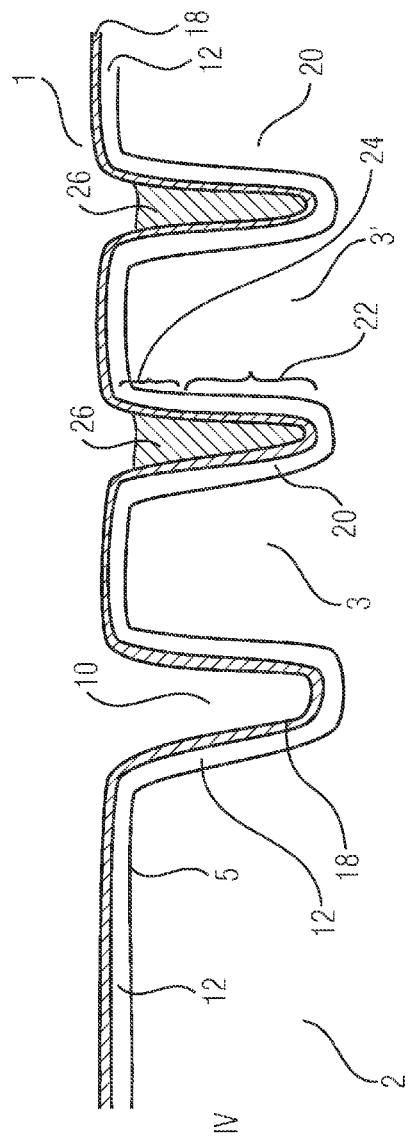
FIG. 5 shows a schematic cross sectional view of the semiconductor structure in the substrate, wherein a lower portion of the second trench remains filled with the protective material.

As it is shown in FIG. 5, by carefully adapting the width of the first and the second trenches and the respective layer thickness a kind of cell structuring or self-masking without employing a physical mask step can be achieved. In that way, the second trenches 20 still comprise in the lower portion 22 protection material 26 for a further optional structuring, whereas the first trench 10 does not comprise anymore a protection material 26. The first trench 10 can therefore in subsequent optional processing steps differently processed then the second trenches.

Figure 3:
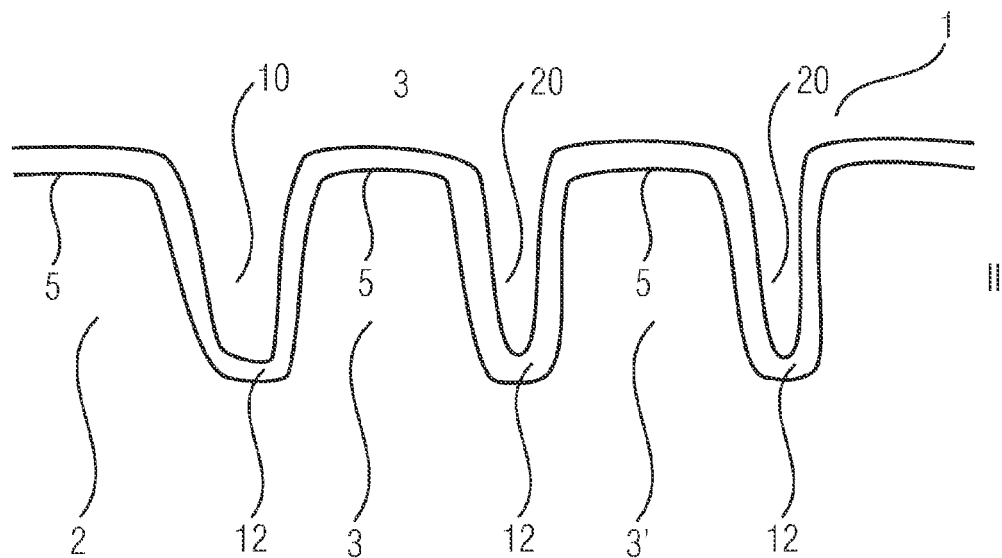
FIG. 3 shows a schematic cross sectional view of the same structure as in FIG. 2 lined, respectively covered with the first insulating layer.

As an optional step in an embodiment of the inventive method a first insulating layer 12 can be formed after forming the first 10 and the second trench 20 (see FIG. 2 to 3). In FIG. 3 the semiconductor structure 1 in a substrate 2 is shown after forming a first insulating layer 12 lining the first trench 10, the second trenches 20 and covering the substrate surface 5'.

The first insulating layer 12 can be an oxide layer, for example, a silicon oxide layer, thermally grown at a high temperature T1. The first insulating layer can be a thick oxide layer, which will be named in the following also as field plate oxide (FPOX). But the first insulating layer may be also a deposited insulating layer, for example, a silicon oxide layer or also a nitride layer. It is also feasible that the insulating layer is comprising another insulating material.

In FIG. 4 the semiconductor structure 1 in a substrate 2 is shown after forming additional the first optional auxiliary layer 18, lining the first trench 10 and the second trenches 20 and covering the substrate surface 5. Furthermore the above mentioned protection material 26 has been deposited, lining the first trench 10 covering the substrate surface 5 and filling the second trench 20. The first auxiliary layer 18 may be for example nitride, which is deposited on the semiconductor structure 1 so that the nitride is lining the first and the second trenches and is covering the substrate surface 5. Instead of a nitride layer, another material could be used, which is protecting the first insulating layer 12, respectively the FPOX layer against a physical or chemical medium, which is employed to remove the protection material 26. The protection material 26 can be deposited on the semiconductor structure 1 after forming the first auxiliary layer 18 so that the protection material 26 is lining the first trench, covering the substrate surface 5 and is filling the second trenches 20.

After that, the protection material 26 can be removed, as already described above, from the first trench 10, lined with the protection material 26, from the upper portions 24 of the second trenches and from the substrate surface 5. The lower portion 22 of the second trenches remain filled with the protection material 26 (see FIG. 5). The semiconductor structure 1 still comprises the first auxiliary layer 18, which is protecting the first insulating layer 12, during the process of removing partially the protection material 26. The first auxiliary layer 18 can act, for example, as an etch stop for a dry or wet etching the protection material 26 in the above mentioned way. The first auxiliary layer 18 can be, for example nitride, which can comprise a different etch selectivity against the etch medium, which is able to etch the protection material 26. The protection material 26 can be for example poly-silicon. In order to remove the protection material 26 in the above described way so that only the second trench remains filled with the protection material, an isotropic etching of the protection material 26 can be performed. Because of the smaller width of the filled second trench, only the protection material in the upper portion 24 of the second trench can be removed by the isotropic etching, whereas the protection material lining the first trench and the substrate surface 5 can be completely removed.

Figure 6:
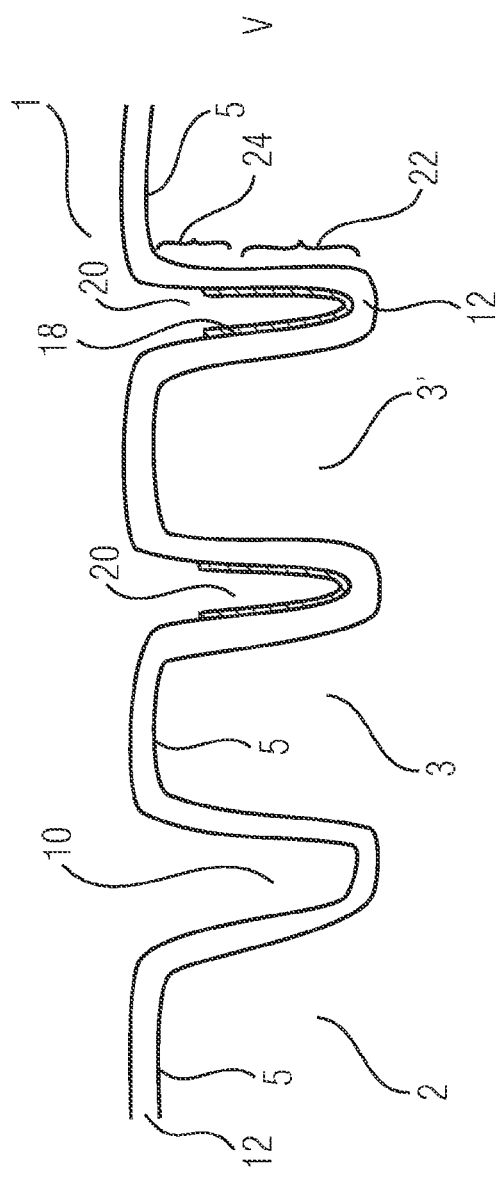
FIG. 6 shows a schematic cross sectional view of the semiconductor structure after removing the first auxiliary layer and the protection material, left in the second trenches.

In FIG. 6, the semiconductor structure 1 in a substrate 2 is depicted after removing the first auxiliary layer 18 from the semiconductor structure so that only the lower portion 22 of the second trenches 20, which have been still filled with the protection material 26 is lined with the first auxiliary layer 18. The protection material 26 left in the second trenches (see FIG. 5) protects the lower portion 22 of the second trenches so that the first auxiliary layer 18 can remain in the lower portion 22. The first auxiliary layer 18 can be removed by conventional means utilized in semiconductor processing. The first auxiliary layer can be, for example again removed by dry or wet etching. In that case, the protection material 26, still left in the lower portion of the second trenches 22, should again comprise a different etch selectivity against the used etching medium then the first auxiliary layer. After removing the first auxiliary layer 18, the protection material 26 left in the lower portion of the second trenches can be removed. This can be done again with conventional means. Removing the protection material 26, left in the lower portion 22 of the second trenches, should be performed so that the first insulating layer 12 is not, or only negligibly, affected.

Figure 7:
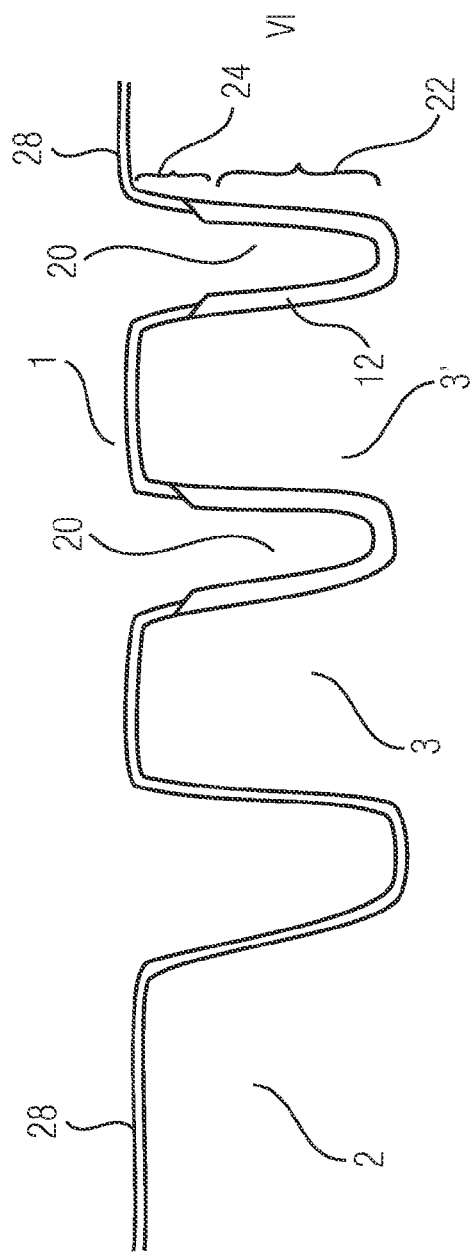
FIG. 7 shows a schematic cross sectional view of the semiconductor structure in a substrate after removing the first insulating layer lining the first trench covering the substrate surface and lining an upper portion of the second trenches and after forming a second insulating layer and removing the first auxiliary layer, left in the second trenches.

The first auxiliary layer 18 left in the lower portion 22 of the second trenches is protecting the first insulating layer 12, for example a field plate oxide, from a subsequent process of removing the first insulating layer 12. The removing of the first insulating layer 12 from the substrate surface 5, the first trench 10 and the upper portion 24 of the second trenches can be done, for example by wet etching the field plate oxide. That means only the first insulating layer 12 in the lower portion 22 of the second trenches is protected by the first auxiliary layer 18 against the removing process, for example against the wet etching of the filed plate oxide layer. After removing the first insulating layer 12 in the above described way, a second insulating layer 28 can be formed lining the first trench, at least the upper portions of the second trenches and covering the substrate surface 5. The forming of the second insulating layer can be done by thermally growing a thin so-called PADOX layer, in order to give an example. As shown in FIG. 7, the first auxiliary layer 18 can then be removed from the lower portion 22 of the second trenches. The second auxiliary layer 28 may also comprise another insulating material like nitride.

FIG. 7 depicts now the semiconductor structure 1 in a substrate 2, wherein the first trench 10, the upper portions 24 of the second trenches are lined and the substrate surface 5 is covered with a second insulating layer 28 thinner than the first insulating layer 12. The lower portion 22 of the second trenches is still lined with the first insulating layer. The above mentioned thickness of the insulating layers, which may be for example silicon oxide layers, are only exemplarily for this embodiment and is no restriction to the inventive method.

In another embodiment of the present invention, the semiconductor structure 1 can then be covered with a photo-resist layer 30 (see FIG. 8), wherein an area of the substrate can be defined by conventional means, which can then be doped so that a doped region 32 can be formed. The doping 34 can be employed, for example with arsenic, phosphorus or antimony to form a n-type doped region 32 or for example with boron for a p-type doped region 32. The defining of the doping region 32, the removing of the photo-resist 30 and the doping 34 can be done with conventional means used for semiconductor processing. The above mentioned doping region 32 could be for example formed as a n-stop-zone for a parasitic n-epi depletion channel MOSFET, which can be formed in subsequent process sequences in the substrate. It is also feasible that other devices or other semiconductor structures are formed in the above described way. Therefore the above mentioned n-doped channel stop-zone is only exemplarily and is therefore no restriction to the inventive method. Similarly, other semiconductor devices or device structures can be formed or semiconductor structures for other purposes can be defined by one skilled in the art, in light of the above. The implantation, respectively the doping 34 in order to form the doping region 32 can be also performed at a later date of the inventive method. After forming the doping region 32, the resist 30 can be removed. It is also feasible that the semiconductor structure 1 in the substrate 2 does not need such a doping region 32, since it does not comprises a device structure based on this processing sequence. The semiconductor structure might for example mainly comprise the first trench 10 and the second trench 20. In that case, the above mentioned covering of the semiconductor structure with the resist 30 and the doping 34 is not necessary.

The semiconductor structure 1, with or without the doping region 32, can now be covered with the second auxiliary layer 36, which is lining the first and the second trench and is covering the substrate surface 5 (see FIG. 9). The second auxiliary layer 36 can comprise, for example, nitride and may be deposited on the semiconductor structure 1. The nitride deposition can be part of a conventional local-oxidation-of-silicon (LOCOS) sequence adapted to the presence of the trenches. The semiconductor structure 1 can then be covered with a resist 30. With a mask-step the resist 30, for example a photo resist, can then be structured so that, for example, the first trench 10 and parts of the substrate surface 5' are exposed. If the semiconductor structure 1 comprises the above mentioned doped region 32 in the substrate, a substrate surface region greater than the doped region 32 can be exposed as well. FIG. 9 depicts a situation after removing the photo resist 30 from the exposed regions of the semiconductor structure 1. It should be mentioned that the exact process sequence might be changed by one skilled in the art in order to achieve the same semiconductor structure. The doping 34, depicted in FIG. 8, to form the doped region 32 can be also performed after depositing the second auxiliary layer 36.

From the exposed parts of the semiconductor structure 1, the second auxiliary layer 36 and the subjacent second insulating layer 28 as well as the remaining photo resist 30 on top of the semiconductor structure 1 can be removed by conventional means used in semiconductor processing.

Figure 10:
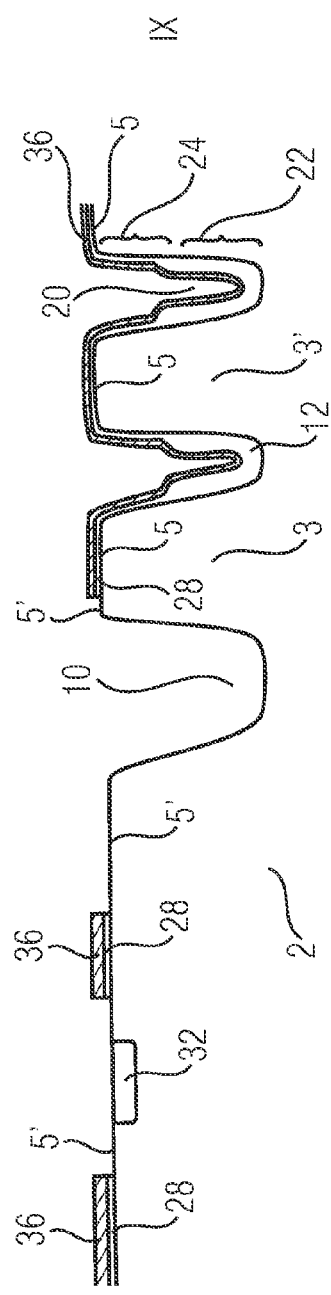
FIG. 10 shows a schematic cross sectional view of the semiconductor structure in a substrate after removing party the second auxiliary layer and the second insulating layer in such regions, defined by the preceding mask step and after removing the remaining resist.

FIG. 10 depicts the semiconductor structure 1 after that. The first trench 10 and parts of the substrate surface 5' do not comprise anymore the second insulating layer 28 and the second auxiliary layer 36. Dependent upon whether the substrate 2 comprises the doped region 32 or any other semiconductor device structures, formed as described in context to the description of FIG. 8, the second insulating layer 28 and the second auxiliary layer 36 can also be removed from the respective substrate surface regions. The second trenches 20 and parts of the substrate surface 5 are still covered, respectively lined with the second auxiliary layer 36, the subjacent second insulating layer 28 and the thicker first insulating layer 12 in the lower portion 22 of the second trenches. The thicker insulating layer 12 might be the above mentioned field plate oxide and the thinner second insulating layer 28 might be the so-called PADOX layer.

Figure 11:
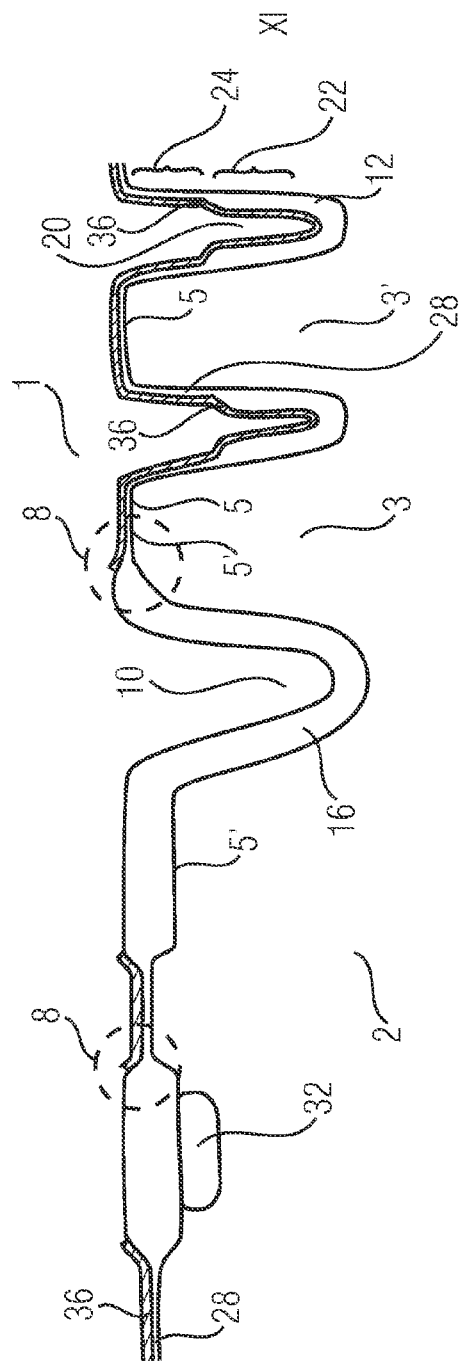
FIG. 11 shows a schematic cross sectional view of the semiconductor structure in a substrate after forming a third insulating layer, lining the first trench and at least another part of the substrate surface above the channel stop zone.
Figure 12:
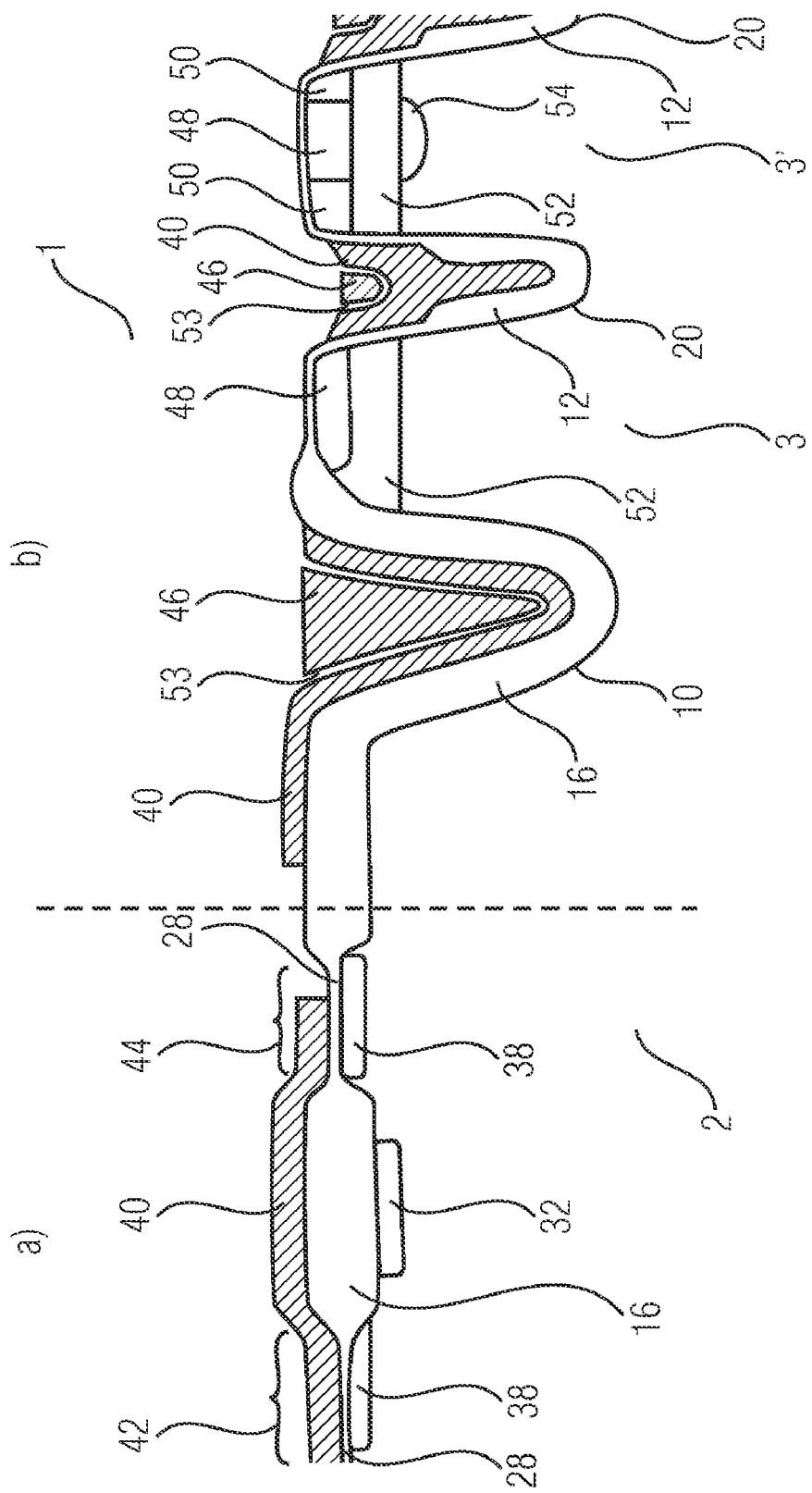
FIG. 12a shows a schematic cross sectional view of a part of the semiconductor structure comprising the channel stop zone between two depletion layer transistors, formed in further process steps.
FIG. 12b shows a schematic cross sectional view of the first and the second trenches after further processing steps, wherein the second trenches are formed as TDMOS transistors comprising a filler layer and doped regions, formed as gate-, source-, drain- and channel regions and a first trench, comprising an electrical conducting material and a structured filler layer.

As it is shown in FIG. 11, a third insulating layer 16 can be formed lining the first trench 10 and covering the exposed substrate surface regions 5'. The forming of the third insulating layer 16 can be for example done by thermally growing a silicon oxide layer, as the substrate 2 consists of silicon. This can be done using the conventional LOCOS technique. The third insulating layer 16 can then be formed as a thick field oxide (FOX). The field oxide can be grown at a lower temperature T2 than the field plate oxide, which is grown at a temperature T1. If the LOCOS technique is used in order to form this third insulating layer 16, the second auxiliary layer 36 can be a nitride layer, for example a $Si_3N_4$ layer and because of the different thermal oxidation rate of the silicon substrate and the nitride layer and a lateral oxide diffusion beneath the nitride layer, the so-called bird's beak is formed at the contact region 8 between the field oxide 16 and the PADOX 28 is formed. This bird's beak extending beneath the nitride layer 36 at the contact region 8 can be characteristic for the LOCOS technique.

After removing the remaining second auxiliary layer 36 lining the second trenches and covering parts of the substrate surface 5, the first trench 10 and the second trench 20 comprise the shape of the semiconductor structure depicted in FIG. 1. With the inventive method only one mask step may be necessary to form the semiconductor structure namely, that is to say the LOCOS mask-step, or more general a mask step to define the exposed areas of the first trench and the substrate surface, which will be covered at a subsequent process sequence with a third insulating layer. The semiconductor structure 1 may furthermore comprise, for example, the above mentioned doped region 32 covered with the field oxide, respectively the third insulating layer or other functional semiconductor device structures in the substrate 2 defined in the mask-step, for example the LOCOS mask-step.

Based on the semiconductor structure depicted in FIG. 11 TDMOS transistors and, for example, based on the embodiment depicted in FIG. 8, wherein a channel stop-zone, adjacent to the first trench 10, is formed by the doped region 32, one or more depletion channel MOSFET may be formed by performing further processing steps. Further processing steps may be performed with conventional means for processing semiconductor structures. The further processing steps described in the following in order to form the above mentioned vertical TDMOS transistor and the adjacent depletion channel transistors may be performed in a different order or some of the mentioned processing steps may be left out, skipped or other processing steps may be added, in order to form the TDMOS transistor and the optional adjacent structure with channel stop-zone and the depletion channel MOSFET.

The remaining second auxiliary layer 36 can be removed and the second insulating layer, e.g. the PADOX layer may be removed or at least partly removed. In the upper portions of the second trenches 20, a gate oxide might be formed at the side walls of the upper portion 24 of the second trenches 20. Electrical conducting material 40, for example poly-silicon material can be deposited so that the first trench is lined and the second trenches are partially filled. The electrical conducting material 40, respectively the poly-silicon can form a gate electrode for a first 42 and a second transistor 44, as it is shown in FIG. 12a, the "logic" region of the semiconductor structure 1. Further processing steps can comprise a depositing of a filler layer 46, filling the first trench 10 and the second trenches 20, shown in the "TDMOS"-region of FIG. 12b. Between the filler layer 46 and the electrically conducting material 40 can be an insulating layer 53, separating the conducting material 40 and the filler layer 46. The filler layer 46 can comprise, for example, again poly-silicon. Furthermore, the filler layer 46 can be structured. By performing different doping processes the depletion zones 38 of the depletion channel MOSFET 42 and 44, depicted in FIG. 12a, can be formed.

The TDMOS transistor shown in FIG. 12b can be formed by performing several doping processes in order to form certain doped regions in the substrate. In the described embodiment, the substrate 2 can be, for example a n-epi doped silicon substrate, the p-doped regions 52 can be the so-called body region of the TDMOS transistor, wherein the channel of the TDMOS transistor, adjacent to the upper portion 24 of the second trenches is formed. Furthermore, the TDMOS transistor can comprise the source region 50, which can be n⁺-doped. The TDMOS transistor may comprise further heavily doped p⁺-regions 48, which can function as a contact region for a contact (not shown in FIG. 12b) in the mesa region 3', which can be located above. A gate region of the vertical TDMOS transistor can be formed by doping, for example the poly-silicon material 40 in the upper portion 24 of the second trenches 20. The mesa regions 3' between two second trenches may further comprise a p-doped region 54.

In order to form a functional TDMOS transistor, there might be still further process steps necessary, which are not explicitly mentioned here. For example, the TDMOS transistors are often covered with a boron phosphate silicate glass (BPSG) layer forming a soft topography for a possible subsequent metallization.

Figure 13:
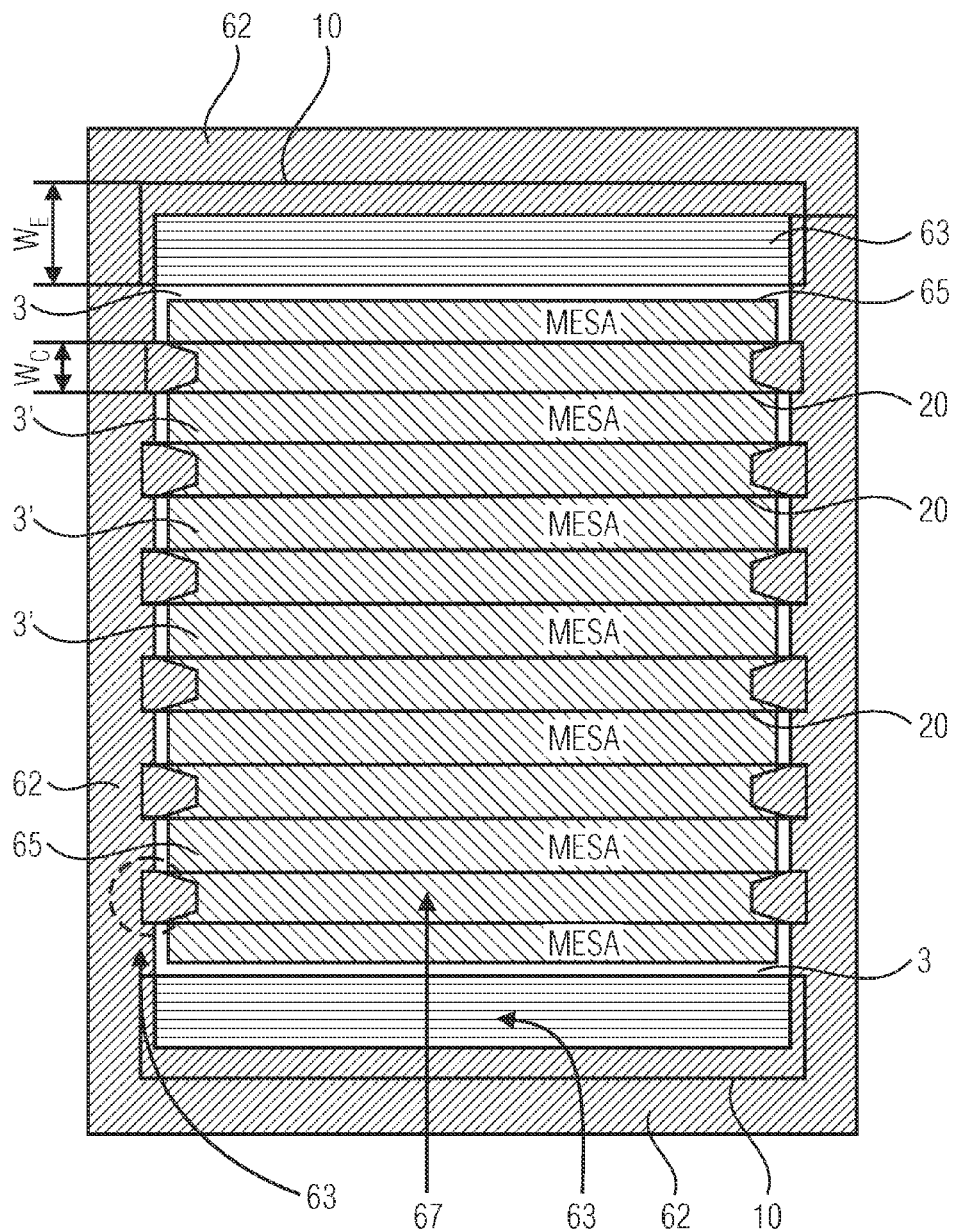
FIG. 13 shows a top view of the schematic layout of a plurality of parallel, linear trenches separated by so-called mesa regions, wherein the first and the last trench are first trenches.

FIG. 13 depicts the layout of a semiconductor structure, wherein the structure comprises a plurality of parallel, linear first trenches 10 and second trenches 20. The first trenches respectively, the so-called edge trenches, comprise, as described above, a width $W_e$ larger than the width $W_c$ of the second trenches. At the end of their longitudinal extension the trenches are not connected. This represents the so-called open trench layout for TDMOS transistors. The width $W_e$ can be, for example, approximately 3 μm and the width for the second trenches $W_c$ can be approximately 1.5 μm in the so-called SMART 6 semiconductor technology. The width $W_e$ of the first trenches 10 may be smaller than 10 μm, 5 μm, 3 μm or 1 μm and the width $W_c$ of the second trenches 20 may be smaller than 8 μm, 3 μm, 1 μm or 100 nm. In FIG. 13 furthermore the mesa regions 3 and 3' and the substrate surface area 62 covered with poly-silicon are shown. The area 63 depicts the regions where the field oxide is covering the trench walls and the area 67 depicts the regions where the field plate oxide is lining the trench bottom of the second trenches. Furthermore the active TDMOS area 65—the active transistor area is shown. If the second trenches are also used with the purpose of defining wells their width $W_c$ should be increased as well, exactly as for the edge trenches of the TDMOS.

Figure 14:
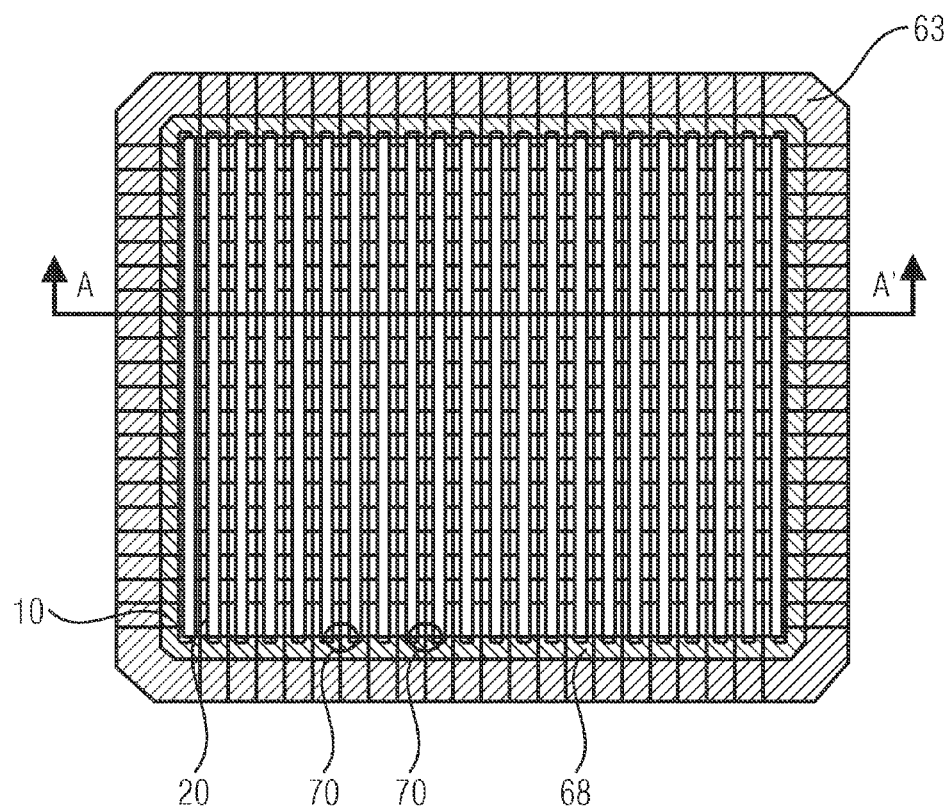
FIG. 14 shows a schematic top view from the layout of a semiconductor structure comprising a plurality of parallel, linear trenches connected to each other at the end of the longitudinal extension, wherein the first and the last trench of the plurality of trenches are second trenches and trenches between the first and the last trench are second trenches.

FIG. 14 shows a semiconductor structure, wherein the structure comprises a plurality of parallel linear first and second trenches connected to each other at the end of their longitudinal extension, wherein the first and the last trench of the plurality of trenches is a first trench 10 and trenches between the first and last trench are second trenches. The second trenches 20 comprise at the end of their longitudinal extension 70 a width approximately equal to the width of the first trenches. FIG. 14 depicts the area 63 comprising the thicker field oxide and the trench region 68 consisting of two first trenches 10 and a plurality of parallel, linear arranged second trenches 20, wherein the first and the second trenches are connected to each other at the end of their longitudinal extension. The end of the longitudinal extension of the second trenches 70 comprises a larger width than the width of the second trenches $W_c$.

Figure 15:
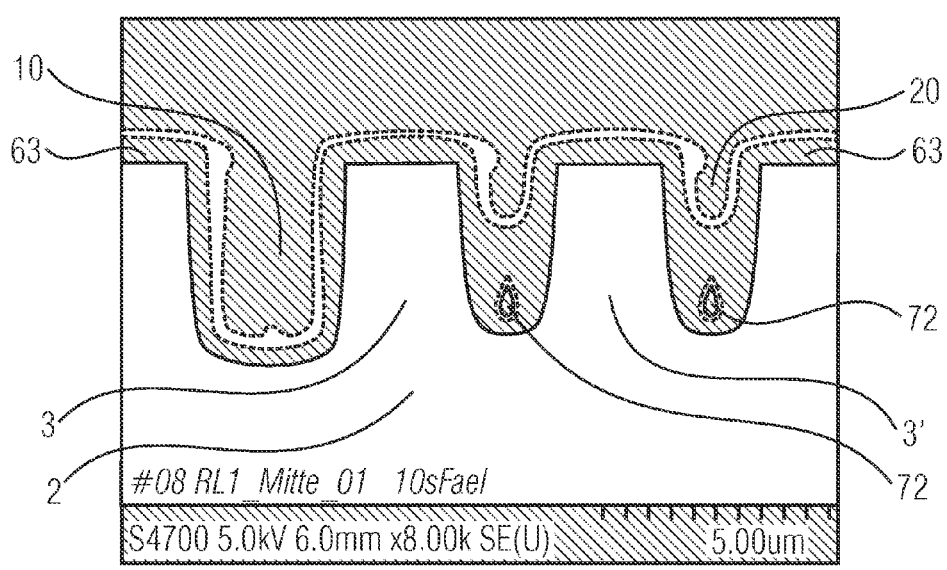
FIG. 15 shows a raster electron microscope (REM) picture of a cross section comprising a first trench and two second trenches.

FIG. 15 shows a raster electron microscope (REM) picture of a cross section AA' of the semiconductor structure shown in FIG. 14. The REM picture comprises one first trench 10 and two second trenches 20. The field oxide oxidation, respectively the forming of the third insulating layer was performed without the LOCOS mask-step. In that case, the field oxide is growing under the already structured field plate oxide, making the concept unusable. The width of the edge trench, respectively the first trench 10 is in this case 3.1 μm, while the body trenches, respectively the second trenches 20, comprise a width of 1.5 μm. Performing the FOX oxidation without a LOCOS mask leads to holes 72 in the lower portion of the second trenches, which is not desirable. This can be prevented by performing masked FOX oxidation with the LOCOS technique.

With the above described method of forming a semiconductor structure in a substrate, a semiconductor structure can be formed comprising a first trench with a first width $W_e$ and a second trench with a second width $W_c$ being formed in a substrate, wherein the first width $W_e$ is larger than the second width $W_c$ of the second trench. A lower portion of the second trench is lined with the first insulating layer, wherein an upper portion of the second trench is lined and at least a part of the substrate surface is covered with the second insulating layer and wherein the first trench is lined and another part of the substrate surface is covered with a third insulating layer. A contact region 8 between the third insulating layer and the second insulating layer is formed like a bird's beak.

The semiconductor structure can further comprise a plurality of second trenches, wherein the first and the second trenches comprising a semiconducting material, wherein the semi-conducting material in the second trenches form gate regions, the second insulating layer in the upper portion of the second trenches is formed as a gate oxide and wherein in the substrate between two second trenches a source-, a drain- and a channel-region for a TDMOS transistor is formed.

As is described above, the semiconductor structure can for example further comprise a parasitic or also a volitional depletion channel MOSFET adjacent to the first trench, wherein the depletion layer transistors are separated by a channel stop-zone, covered with the third insulating layer. With the above described inventive method it can be possible to form a semiconductor structure, comprising at least two insulating layers with a different thickness with only one mask step. The insulating layers can comprise the same material, for example silicon oxide. This mask-step is applied to define the areas of the semiconductor structure, comprising later on the third insulating layer. This can be, for example, the LOCOS mask step. So far two mask steps were needed in order to realize thermally grown oxide in trenches and on top of the surfaces of silicon wafers comprising a different thickness. Furthermore this invention may offer the possibility to get a soft topography of a standard LOCOS technique for the semiconductor structure. Using, for example, the field plate oxide with the functionality of the field oxide, the respective topography of the BPSG layer located on it is not soft. This might be not possible, by using only one insulating layer, respectively an oxide layer, to fulfill the functionalities of a field plate oxide and a field oxide. As it is described above, other device structures, or semiconductor structures with different purposes, for example, the channel stop-zone, can be integrated in the technology without an additional mask-step. The conventional way to form such TDMOS transistors is the use of two masks for structuring a high temperature grown field plate oxide and a low temperature grown field oxide, preceded by an n-type implantation, compatible with field oxide oxidation in order to form a channel stop-zone. Another conventional method to form TDMOS transistors is to accept a single oxide layer with a thickness optimized only for trench field plating, wherein a field plate oxide, which has a good conformity and a low stress level in the trenches is to prefer and a second mask dedicated to form the channel stop-zone function. But in this case, the soft topography of the BPSG layer on top of the semiconductor structure, which is desirable, cannot be achieved.

The invention allows realization of a conventional field plate oxide functionality in a trench structure for TDMOS transistors as described above, through the use of both field plate oxide and field oxide. The field plate oxide is not structured while the field oxide is. This can be performed with saving one mask level. In order to achieve this, the trenches can be etched, the field plate oxide can be grown at a high temperature. Afterwards a blank field plate oxide structuring sequence can be performed, which leads to one mask saving. The following execution of a LOCOS sequence adapted to the presence of the trenches, may require then one mask step.

Trenches of TDMOS transistors and of other semiconductor structures using such trenches, which may be eventually present in a respective semiconductor device layout library should be designed with a proper layout in order to realize the field plate functionality through both the field plate oxide and the field oxide and not only through the field plate oxide. The field plate oxide can be left in the trenches where it is desired in spite of its unmasked structuring if the trench width is suitably modulated. As already mentioned above the width of the respective structures have to be chosen carefully. The portions of the trenches where the field plate oxide is absent can be exposed to a following field oxide oxidation through a properly modified LOCOS sequence. As the trench width is big enough, the third insulating layer grown through the field oxide oxidation can sufficiently conform to the trench profile. Although the stress generation for the semiconductor structure introduced by the field oxide oxidation is acceptable. The increase of the TDMOS size due to the larger width of the first trenches, respectively, the edge trenches, can be accepted.

An alternative solution of blanket structuring the field plate oxide without performing the mask step on the TDMOS transistors, having trenches with the same width, which corresponds to the standard layout and performing afterwards a LOCOS outside of the TDMOS, would leave portions of its edge trenches only with a gate oxide on them at the end of the process. Therefore the voltage capability for those edge trenches would be not assured. If the LOCOS were performed also on TDMOS edge trenches, where the field plate oxide is still present and structured, a thick oxide would grow with a hole in the field plate oxide in the bottom of the trenches.

The so-called open trench layout concept for TDMOS with different widths of the edge trenches represents one possibility. In the open trench layout concept the TDMOS transistors consists of parallel, linear trenches, which are not connected to each other. If were used although with the purpose of defining the wells, the width should be increased as well, exactly as for the edge trenches of the TDMOS. Other TDMOS layout solutions, where the closed trench concept is used, are usable as well. In the closed trench concept, the TDMOS consists of parallel, linear trenches connected to each other at the end of their longitudinal extensions.

For the method of forming a semiconductor structure in a substrate, a chip area can be selected where the field plate oxide is using the layout and not a lithographic step to define the field plate oxide areas. In order to perform the method of forming a semiconductor structure in a substrate, the layout size can be used in order to determine where the field plate oxide is present in the trenches. Furthermore, the LOCOS process can be performed, wherein the nitride can be isotropically instead of anisotropically etched. Furthermore a proper layout concept for TDMOS transistors, for example, the so-called open trench concept, can be applied.

The invention claimed is:

1. A method of forming a semiconductor structure in a substrate, comprising:
   forming a first trench with a first width $W_e$ and a second trench with a second width $W_c$ (I), wherein the first width $W_e$ is larger than the second width $W_c$;
   depositing a protection material (III), lining the first trench, covering the substrate surface and filling the second trench;
   removing partially the protection material (IV), wherein a lower portion of the second trench remains filled with the protection material;
   forming a first insulating layer (II) and a first auxiliary layer (III) thereon, both lining the first and the second trench and covering the substrate surface;
   processing the semiconductor structure (V; VI), wherein the first insulating layer remains in the lower portion of the second trench;
   forming a second insulating layer (VI), lining the first trench and an upper portion of the second trench and covering the substrate surface;
   depositing the second auxiliary layer (VIII), lining the first and the second trench and covering the substrate surface;
   structuring the semiconductor structure (IX), wherein the second trench and at least a part of the substrate surface remains lined respectively covered with the second auxiliary layer; and
   forming a third insulating layer (XI), lining the first trench and at least another part of the substrate surface;
   wherein the processing of the semiconductor structure comprises:
      removing of the first auxiliary layer;
      removing of the protection material left in the lower portion of the second trench; and
      removing of the first insulating layer in the first trench, on the substrate surface and the upper portion of the second trench.

2. The method according to claim 1, wherein the structuring the semiconductor structure comprises:
   depositing a resist on top of the substrate; and
   applying a photolithographic mask-step.

3. A method of forming a semiconductor structure in a substrate, comprising:
   forming a first trench with a first width $W_e$ and a second trench with a second width $W_c$ (I), wherein the first width $W_e$ is larger than the second width $W_c$;
   forming a first insulating layer (II) and a first auxiliary layer (III) thereon, both lining the first and the second trench and covering the substrate surface;
   depositing a protection material (III), lining the first trench, covering the substrate surface and filling the second trench;
   removing partially the protection material (IV), wherein a lower portion of the second trench remains filled with the protection material;
   processing the semiconductor structure (V; VI), wherein the first insulating layer remains in the lower portion of the second trench;
   forming a second insulating layer (VI), lining the first trench and an upper portion of the second trench and covering the substrate surface;
   depositing the second auxiliary layer (VIII), lining the first and the second trench and covering the substrate surface;
   structuring the semiconductor structure (IX), wherein the second trench and at least a part of the substrate surface remains lined respectively covered with the second auxiliary layer;
   forming a third insulating layer (XI), lining the first trench and at least another part of the substrate surface;
   removing of the first auxiliary layer;
   removing of the protection material left in the lower portion of the second trench; and removing of the first insulating layer in the first trench, on the substrate surface and the upper portion of the second trench.

4. The method according to claim 3, wherein the structuring the semiconductor structure comprises:
depositing a resist on top of the substrate; and
applying a photolithographic mask-step.

5. The method according to claim 3, wherein after forming the third insulating layer further processing steps are applied, comprising at least one of the following steps:
removing of the second auxiliary layer;
removing of the second insulating layer;
forming a gate oxide in the upper portion of the second trench;
depositing an electrical conducting material lining the first trench and partially filling the second trench;
depositing a filler layer in the first and the second trench;
performing a patterning of the filler layer;
performing at least a doping of the substrate material; and
covering the semiconductor structure with a protection layer.

6. The method according to claim 5, wherein the semiconductor structure comprises a plurality of second trenches, wherein the further processing steps are performed to form second trenches as trench double-diffused-metal-oxide-semiconductor (TDMOS) field-effect-transistor (EET).

7. The method according to claim 6, wherein the doping is performed so that a gate region in the second trench and a channel-, a source- and a drain-region of a TDMOS in the substrate between two second trenches is formed.

8. The method according to claim 5, wherein the removing of the second auxiliary layer comprises a removal of a nitride layer, wherein the removing of the second insulating layer comprises the removing of a thermally grown PADOX layer, wherein depositing an electrical conducting material is performed by a poly-silicon depositing, wherein the depositing of a filler layer comprises a poly-silicon depositing, wherein the patterning of the filler layer comprises a patterning of the poly-silicon layer, wherein the doping comprises the forming of a source-, drain- and channel-region in the substrate material between two second trenches and a gate-region in the second trench, to form a TDMOS transistor.

9. The method according to claim 3, wherein the method further comprises a doping process (VII) of a part of the substrate with a first dopant before the structuring.

10. The method according to claim 9, wherein the structuring is performed so that at least the second auxiliary layer is at least removed above the part of the substrate comprising the first dopant.

11. The method according to claim 10, wherein the forming of the third insulating is performed, so that the part of the substrate comprising the first dopant is additionally covered with the third insulating layer.

12. The method according to claim 11, wherein the further processing steps are performed so that the part of the substrate comprising the first dopant is formed as a channel stop-zone for transistors, formed adjacent to the channel stop-zone.

13. The method according to claim 3, wherein forming a first trench and a second trench comprise a dry etching or a wet etching.

14. The method according to claim 3, wherein the forming of the first insulating layer is a thermally growing of a oxide layer at a temperature T1.

15. The method according to claim 3, wherein the forming of a third insulating layer is a thermally growing of a oxide layer at a temperature T2.

16. The method according to claim 15, wherein the temperature T1 is greater than the temperature T2.

17. The method according to claim 3, wherein the third insulating layer comprises a thickness larger than the first insulating layer, and the first insulating layer comprises a thickness larger than the second insulating layer.

18. The method according to claim 3, wherein the forming of a first auxiliary layer comprises a deposition.

19. The method according to claim 3, wherein the protection material comprises poly-silicon material.

20. The method according to claim 3, wherein the removing partially the protection material comprises an isotropic etching.

21. The method according to claim 3, wherein the second insulating layer is thermally grown oxide.

22. The method according to claim 3, further comprises, after depositing a second auxiliary layer, a removing of the first auxiliary layer left in the lower portion of the second trench.

23. The method according to claim 3, wherein the second auxiliary layer comprises nitride.

24. The method according to claim 3, wherein the forming of the first and the second trench is performed so that the first and the second trench consists of parallel, linear trenches connected to each other at the end of their longitudinal extension, wherein the second trench comprises at the end of its longitudinal extension a width approximately equal to the width of the first trench.

25. The method according to claim 3, wherein the forming of the first and the second trench is performed such that the first and the second trench consists of parallel linear trenches not connected to each other at the end of the longitudinal extension.

26. The method according to claim 3, wherein a plurality of parallel linear trenches is formed, connected or not connected to each other at the end of the longitudinal extension, wherein the first and the last trench of the plurality of trenches is a first trench.

27. A method of forming a semiconductor structure in a substrate, comprising:
forming a first trench with a first width $W_e$ and a second trench with a second width $W_c$ (I), wherein the first width $W_e$ is larger than the second width $W_c$;
forming a first insulating layer (II) and a first auxiliary layer (III) thereon, both lining the first and the second trench and covering the substrate surface;
depositing a protection material (III), lining the first trench, covering the substrate surface and filling the second trench;
removing partially the protection material (IV), wherein a lower portion of the second trench remains filled with the protection material;
processing the semiconductor structure (V; VI), wherein the first insulating layer remains in the lower portion of the second trench;
forming a second insulating layer (VI), lining the first trench and an upper portion of the second trench and covering the substrate surface;
depositing the second auxiliary layer (VIII), lining the first and the second trench and covering the substrate surface;
structuring the semiconductor structure (IX), wherein the second trench and at least a part of the substrate surface remains lined respectively covered with the second auxiliary layer; and
forming a third insulating layer (XI), lining the first trench and at least another part of the substrate surface;

wherein after forming the third insulating layer further processing steps are applied, comprising at least one of the following steps:
  removing of the second auxiliary layer;
  removing of the second insulating layer;
  forming a gate oxide in the upper portion of the second trench;
  depositing an electrical conducting material lining the first trench and partially filling the second trench;
  depositing a filler layer in the first and the second trench;
  performing a patterning of the filler layer;
  performing at least a doping of the substrate material; and
  covering the semiconductor structure with a protection layer.

28. The method according to claim 27, wherein the semiconductor structure comprises a plurality of second trenches, wherein the further processing steps are performed to form second trenches as trench double-diffused-metal-oxide-semiconductor (TDMOS) field-effect-transistor (EET).

29. The method according to claim 28, wherein the doping is performed so that a gate region in the second trench and a channel-, a source- and a drain-region of a TDMOS in the substrate between two second trenches is formed.

30. The method according to claim 27, wherein the removing of the second auxiliary layer comprises a removal of a nitride layer, wherein the removing of the second insulating layer comprises the removing of a thermally grown PADOX layer, wherein depositing an electrical conducting material is performed by a poly-silicon depositing, wherein the depositing of a filler layer comprises a poly-silicon depositing, wherein the patterning of the filler layer comprises a patterning of the poly-silicon layer, wherein the doping comprises the forming of a source-, drain- and channel-region in the substrate material between two second trenches and a gate-region in the second trench, to form a TDMOS transistor.

31. A method of forming a semiconductor structure in a substrate, comprising:
  forming a first trench with a first width $W_e$ and a second trench with a second width $W_c$ (I), wherein the first width $W_e$ is larger than the second width $W_c$;
  forming a first insulating layer (II) and a first auxiliary layer (III) thereon, both lining the first and the second trench and covering the substrate surface;
  depositing a protection material (III), lining the first trench, covering the substrate surface and filling the second trench;
  removing partially the protection material (IV), wherein a lower portion of the second trench remains filled with the protection material;
  processing the semiconductor structure (V; VI), wherein the first insulating layer remains in the lower portion of the second trench;
  forming a second insulating layer (VI), lining the first trench and an upper portion of the second trench and covering the substrate surface;
  depositing the second auxiliary layer (VIII), lining the first and the second trench and covering the substrate surface;
  structuring the semiconductor structure (IX), wherein the second trench and at least a part of the substrate surface remains lined respectively covered with the second auxiliary layer; and
  forming a third insulating layer (XI), lining the first trench and at least another part of the substrate surface;
  wherein the method further comprises a doping process (VII) of a part of the substrate with a first dopant before the structuring.

32. The method according to claim 31, wherein the structuring is performed so that at least the second auxiliary layer is at least removed above the part of the substrate comprising the first dopant.

33. The method according to claim 32, wherein the forming of the third insulating is performed, so that the part of the substrate comprising the first dopant is additionally covered with the third insulating layer.

34. The method according to claim 33, wherein the further processing steps are performed so that the part of the substrate comprising the first dopant is formed as a channel stop-zone for transistors, formed adjacent to the channel stop-zone.

35. A method of forming a semiconductor structure in a substrate, comprising:
  forming a first trench with a first width $W_e$ and a second trench with a second width $W_c$ (I), wherein the first width $W_e$ is larger than the second width $W_c$;
  forming a first insulating layer (II) and a first auxiliary layer (III) thereon, both lining the first and the second trench and covering the substrate surface;
  depositing a protection material (III), lining the first trench, covering the substrate surface and filling the second trench;
  removing partially the protection material (IV), wherein a lower portion of the second trench remains filled with the protection material;
  processing the semiconductor structure (V; VI), wherein the first insulating layer remains in the lower portion of the second trench;
  forming a second insulating layer (VI), lining the first trench and an upper portion of the second trench and covering the substrate surface;
  depositing the second auxiliary layer (VIII), lining the first and the second trench and covering the substrate surface;
  structuring the semiconductor structure (IX), wherein the second trench and at least a part of the substrate surface remains lined respectively covered with the second auxiliary layer; and
  forming a third insulating layer (XI), lining the first trench and at least another part of the substrate surface;
  wherein the forming of a third insulating layer is a thermally growing of a oxide layer at a temperature T2.

36. The method according to claim 35, wherein the temperature T1 is greater than the temperature T2.

37. A method of forming a semiconductor structure in a substrate, comprising:
  forming a first trench with a first width $W_e$ and a second trench with a second width $W_c$ (I), wherein the first width $W_e$ is larger than the second width $W_c$;
  forming a first insulating layer (II) and a first auxiliary layer (III) thereon, both lining the first and the second trench and covering the substrate surface;
  depositing a protection material (III), lining the first trench, covering the substrate surface and filling the second trench;
  removing partially the protection material (IV), wherein a lower portion of the second trench remains filled with the protection material;
  processing the semiconductor structure (V; VI), wherein the first insulating layer remains in the lower portion of the second trench;

forming a second insulating layer (VI), lining the first trench and an upper portion of the second trench and covering the substrate surface;

depositing the second auxiliary layer (VIII), lining the first and the second trench and covering the substrate surface;

structuring the semiconductor structure (IX), wherein the second trench and at least a part of the substrate surface remains lined respectively covered with the second auxiliary layer; and forming a third insulating layer (XI), lining the first trench and at least another part of the substrate surface;

wherein, after depositing a second auxiliary layer, the first auxiliary layer left in the lower portion of the second trench is removed.

38. A method of forming a semiconductor structure in a substrate, comprising:

forming a first trench with a first width $W_e$ and a second trench with a second width $W_c$ (I), wherein the first width $W_e$ is larger than the second width $W_c$;

forming a first insulating layer (II) and a first auxiliary layer (III) thereon, both lining the first and the second trench and covering the substrate surface;

depositing a protection material (III), lining the first trench, covering the substrate surface and filling the second trench;

removing partially the protection material (IV), wherein a lower portion of the second trench remains filled with the protection material;

processing the semiconductor structure (V; VI), wherein the first insulating layer remains in the lower portion of the second trench;

forming a second insulating layer (VI), lining the first trench and an upper portion of the second trench and covering the substrate surface;

depositing the second auxiliary layer (VIII), lining the first and the second trench and covering the substrate surface;

structuring the semiconductor structure (IX), wherein the second trench and at least a part of the substrate surface remains lined respectively covered with the second auxiliary layer; and forming a third insulating layer (XI), lining the first trench and at least another part of the substrate surface;

wherein the forming of the first and the second trench is performed so that the first and the second trench consists of parallel, linear trenches connected to each other at the end of their longitudinal extension, wherein the second trench comprises at the end of its longitudinal extension a width approximately equal to the width of the first trench.

\* \* \* \* \*